Figure 1:
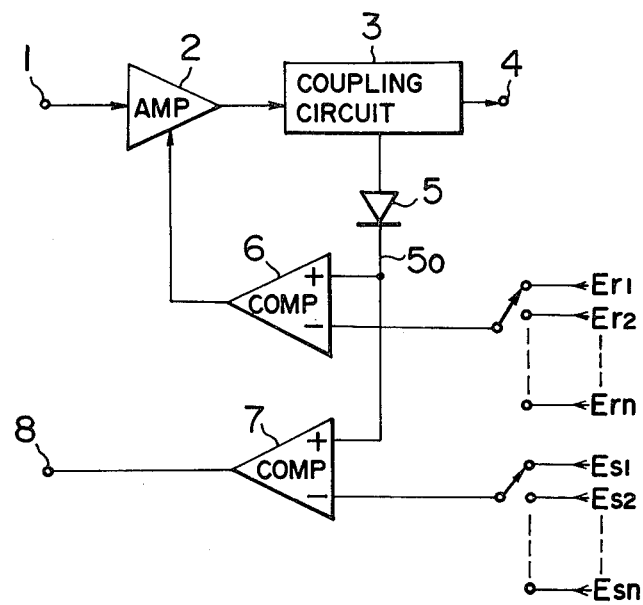

United States Patent [19]

Fujiwara

[11] Patent Number: 4,476,437

[45] Date of Patent: Oct. 9, 1984

[54] SYSTEM FOR DETECTING ABNORMAL CONDITION OF HIGH FREQUENCY OUTPUT SIGNAL IN ITS POWER LEVEL

[75] Inventor: Yukinari Fujiwara, Musashimurayama, Japan

[73] Assignee: Hitachi Denshi Kabushiki Kaisha, Tokyo, Japan

[21] Appl. No.: 358,439

[22] Filed: Mar. 15, 1982

[30] Foreign Application Priority Data

Mar. 20, 1981 [JP] Japan .................................. 56-39650

[51] Int. Cl.³ ............................................. H03G 3/20
[52] U.S. Cl. ....................................... 330/138; 330/2; 330/279
[58] Field of Search ..................... 330/2, 86, 129, 138, 330/207 P, 140, 279, 282, 298; 455/67, 89, 115, 117, 136, 217, 226, 232, 234

[56] References Cited

U.S. PATENT DOCUMENTS

| | | | |
|---|---|---|---|
| 4,109,213 | 8/1978 | Holley et al. | 330/2 |
| 4,143,331 | 3/1979 | Page | 330/2 |
| 4,185,248 | 1/1980 | Namura et al. | 330/2 |

*Primary Examiner*—James B. Mullins
*Attorney, Agent, or Firm*—Antonelli, Terry & Wands

[57] ABSTRACT

A system for detecting an abnormal condition of a high frequency output signal in its power level, comprising: a variable gain power amplifier which receives a high frequency input signal and produces an amplified high frequency output signal; a negative feedback control loop connected to the power amplifier, for automatically setting the power level of the amplified high frequency output signal to a desired one of a plurality of predetermined power levels, the negative feedback control loop being so arranged as to produce a DC signal which is constant in its magnitude so far as the power level of the high frequency output signal is maintained at its set value whichever one is selected from the plurality of predetermined power levels, the gain of the power amplifier being controlled on the basis of the DC signal; and a comparator which compares the DC signal with a reference signal to judge as to whether the high frequency output signal is abnormal or not in its power level.

2 Claims, 2 Drawing Figures

SYSTEM FOR DETECTING ABNORMAL CONDITION OF HIGH FREQUENCY OUTPUT SIGNAL IN ITS POWER LEVEL

This invention relates to a system for detecting an abnormal condition of a high frequency output signal in its power level and more particularly to an improvement of a detecting circuit adapted to judge abnormality in the power level of an output signal produced by an automatic power control circuit which can selectively set one of a plurality of power levels.

In a mobile-telephone radio-communication system, for example, it is sometimes required that a selected one of a plurality of transmission power levels can be set. It is also sometimes required that a circuit is provided for detecting such an abnormal condition that the output power level varies abnormally from the preset value due to a failure of the apparatus and for stopping the transmission output upon the detection of such an abnormal condition.

Figure 2:
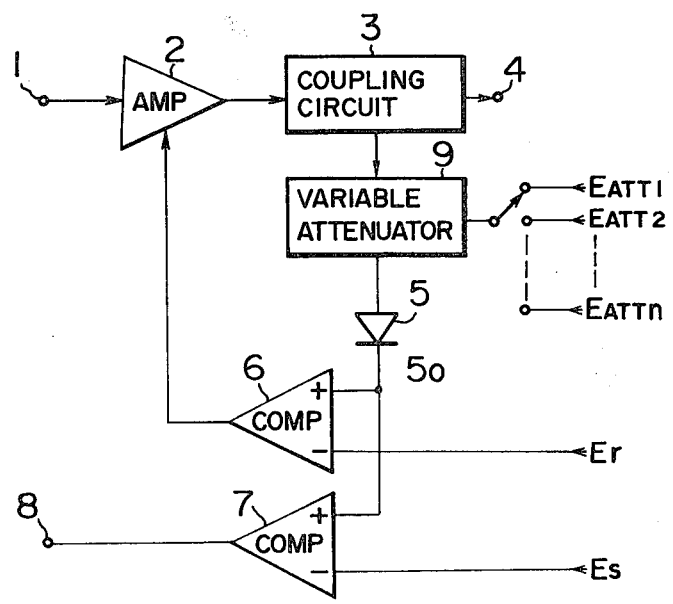

Prior art and the present invention will be described with reference to the attached drawings in which:

FIG. 1 is a block diagram of a prior art high frequency signal power level condition detecting system; and FIG. 2 is a block diagram of a high frequency signal power level condition detecting system in accordance with the present invention.

The prior art high frequency signal power level condition detecting system as shown in FIG. 1 has a power control circuit and a detection circuit for detecting an abnormality in the output of the power control circuit. For simplicity of illustration, FIG. 1 shows only the case where detection is made when the output power level abnormally falls below a preset power level.

In operation, a high frequency input signal is applied to an input terminal 1, amplified in a power amplifier 2 with a variable power gain terminal, and then produced at an output terminal 4, through a coupling circuit 3, on one hand.

On the other hand, a portion of the high frequency output signal is produced from the coupling circuit 3 is converted by a detector 5 into a DC signal $5_0$ serving as a power level control signal. The power level control signal is compared by a comparing amplifier 6 with a reference voltage $E_{r1}$ for power level setting. An amplified error signal which is produced on the output of the comparing amplifier 6 and serves as a gain control signal is applied to the variable gain terminal of the power amplifier 2. Since the closed circuit comprised of the power amplifier 2, coupling circuit 3, detector 5 and comparing amplifier 6 sets up a negative feedback loop, the high frequency output signal at the output terminal 4 is controlled so as to be held in a power level corresponding to the setting reference voltage $E_{r1}$. Where it is desired to selectively set one of a plurality of power levels, a plurality of reference voltages $E_{r1}$ to $E_{rn}$ corresponding to required power levels as provided as shown in FIG. 1 and they are switched over as desired.

As will be seen from FIG. 1, the construction of this power level setting circuit is such that when the reference voltage $E_{r1}$ is selected and the system is in the normal operation, that is, when the power level of the high frequency output signal at the terminal 4 is maintained at a level corresponding to the setting reference voltage $E_{r1}$, the DC signal $5_0$ produced from the detector 5 becomes equal to the reference voltage $E_{r1}$. Similarly, when another reference voltage $E_{r2}, \ldots$ or $E_{rn}$ is selected, the DC signal $5_0$ is made equal to $E_{r2}, \ldots$ or $E_{rn}$, respectively, in the normal operation of the system. Accordingly, for detection of an abnormal operation of the system wherein the power level of the high frequency output signal abnormally varies, for example, decreases below the setting value, another comparing amplifier 7 is provided as shown in FIG. 1. The comparing amplifier 7 has two input terminals one of which is connected to the DC output signal $5_0$ of the detector 5 and the other of which is selectively connected to the abnormality detection reference voltage $E_{s1}, E_{s2}, \ldots$ or $E_{sn}$ corresponding to the power level setting voltages $E_{r1}, E_{r2}, \ldots$ or $E_{rn}$ respectively, and the two input voltages are compared at the comparing amplifier 7 to produce an abnormality signal at an abnormality detection output terminal 8 when an abnormal condition occurs which is represented by, for example, $5_0 < E_{s1}$. With this prior art system, however, the plurality of abnormal power level detection reference voltages $E_{s1}$ to $E_{sn}$ corresponding to the plurality of power level setting referenece voltages $E_{r1}$ to $E_{rn}$ are required. In addition, the operating level of the detector 5 varies depending on the selection of the power level set by the reference voltages and hence difficulties are encountered in providing uniform characteristics, especially, temperature characteristics of the detector 5 over a wide range corresponding to all the reference voltages, resulting in poor accuracy in the abnormal power level detection.

It is an object of the present invention to eliminate the prior art drawbacks as mentioned above.

It is another object of the present invention to improve the accuracy in abnormal power level detection by using an automatic power level control system in which the operating level of the detector is made uniform irrespective of the setting of the output power level.

According to this invention, there is provided a system for accurately detecting an abnormal condition of a high frequency output signal in its power level. The detecting system comprises variable gain control power amplifier means which receives a high frequency input signal and produces an amplified high frequency output signal, and negative feedback control loop means which is connected to the power amplifier means to automatically set the power level of the high frequency output signal to a desired one of a plurality of predetermined power levels. The negative feedback control loop means produces a DC signal of a constant magnitude so far as the power level of the amplified high frequency output signal is maintained at its set value whichever one is selected from the plurality of predetermined power levels, the gain of power amplifier means being controlled on the basis of the DC signal. The detecting system further comprises means for comparing the DC signal with a predetermined reference signal to judge as to whether the high frequency output signal is abnormal or not in its power level.

A preferred embodiment of this invention will be described with reference to FIG. 2 in which the numerals are used to indicates those constituent elements of FIG. 1 having the same functions.

In operation, a high-frequency input signal is applied to an input terminal 1, amplified in a power amplifier 2 with a variable power gain terminal, and then fed to an output terminal 4, through a coupling circuit 3, on one hand.

On the other hand, a portion of the high frequency output power is fed through the coupling circuit 3 to a variable attenuator 9. The output signal of the attenuator 9 is converted by a detector 5 into a DC voltage signal $5_0$ serving as a power control signal. The attenuation factor of the variable attenuator 9 is set by a desired one of a plurality of attenuation setting signals $E_{ATT1}$ to $E_{ATTn}$. Each of the attenuation setting signals $E_{ATT1}$ to $E_{ATTn}$ are provided corresponding to each of a plurality of output power level values to be set, respectively and a desired one of the attenuation setting signals is selected correspondingly to a desired cutput power level setting value. This attenuator 9 is so constructed as to produce an output signal of a constant magnitude to cause the detector 5 to produce the DC voltage signal $5_0$ of a magnitude which is constant so far as the power level of the high frequency output signal at the terminal 4 is maintained at a desired value as set corresponding to a selected one of the attenuation setting signals $E_{ATT1}$ to $E_{ATTn}$, that is, at any selected one of a plurality of settable output power levels. The DC voltage signal $5_0$ is compared with a control reference voltage $E_r$ to set the absolute output power at terminal 4 and an amplified error signal is applied to the variable gain terminal of the power amplifier 2 if there is any difference therebetween. Since a closed circuit comprised of the power amplifier 2, coupling circuit 3, variable attenuator 9, detector 5 and comparing amplifier 6 sets up a negative feedback loop, the gain of the power amplifier 2 is always controlled so that $5_O = E_r$, and as a result, the power level of the high frequency output signal at the output terminal 4 is maintained at a desired level as set by the attenuator 9.

Accordingly, for detection of an abnormal operation wherein the actual output power level abnormally varies, for example falls below the desired output power level, the provision of another comparing amplifier 7 suffices which has one input terminal applied with the output voltage $5_0$ of the detector 5 and the other input terminal applied with only one abnormality detection reference voltage $E_s$. The DC output voltage $5_0$ and the reference voltage $E_s$ are compared to produce an abnormality signal at an abnormality detection output terminal 8 when an abnormal condition occurs such that $5_0 < E_s$. Since, in this manner, the attenuation factor of the attenuator 9 is so set that the operating level of the detector 5 is constant irrespective of the selection of any one of the plurality of output power setting levels, temperature compensation for the detector 5 and/or the comparing amplifier 7 may be easily performed and at the same time, the accuracy of the abnormal power level detection may be improved. Each of the power amplifier, the coupling circuit, the attenuator, the detector, and the comparing amplifier in the above-mentioned embodiment can be materialized with a commonly known circuit in the art.

While, in the foregoing embodiment, description has been made only as to the case where such an abnormal condition that the power level of a high frequency output signal falls below a preset power level is detected, another abnormal condition in which the power level comes outside or beyond a preset range of an output power level setting may obviously be detected with high accuracy based on the same principle by using a window type comparator as the comparing amplifier 7.

As has been described, in the system according to the present invention, the reference level setting for the abnormality detection can easily be set and the detection of abnormal condition in the output power level can be detected with high accuracy. The system can therefore advantageously be applicable to, for example, a transmission output controller of a mobile-telephone radio communication system.

What is claimed is:

1. A system for detecting an abnormal condition of a high frequency output signal in its power level, comprising:

variable gain power amplifier means receiving a high frequency input signal to produce an amplified high frequency output signal therefrom;

negative feedback control loop means connected to said power amplifier means and for automatically setting the power level of said amplified high frequency output signal to a desired one of a plurality of predetermined power levels, said negative feedback control loop means including variable attenuator means connected to an output of said power amplifier means and for attenuating the level of a high frequency output signal from said amplifier means with a variable attenuation factor, means for selecting one of a plurality of attenuation signals respectively corresponding to said plurality of predetermined power levels such that said selected attenuation signal corresponds to said desired power level and for applying said selected attenuation signal to said attenuator means so that the attenuation factor is set correspondingly to said selected attenuation signal, detector means for converting an output signal of said attenuator means into a DC signal, and first comparing means for comparing said DC signal with a first predetermined reference signal to produce a difference signal, the gain of said power amplifier means being controlled by said difference signal, said variable attenuation factor being chosen such that said DC signal is constant in its magnitude so far as the power level of said amplified high frequency output signal is maintained at a set value regardless of which one is selected from said plurality of predetermined power levels; and judging means including second comparing means for comparing said DC signal with a second predetermined reference signal, and output terminal means connected to the output of said second comparing means to produce an abnormality signal corresponding to a difference signal of said second comparing means.

2. A system according to claim 1, wherein said attenuation factor is set in correspondence with said plurality of attenuation signals such that said variable attenuator means attenuates an applied power thereto to substantially the same level as the level of said first predetermined reference signal which applied power is any one of said plurality of predetermined power levels.

* * * * *